United States Patent
Cousins

(10) Patent No.: US 8,878,053 B2
(45) Date of Patent: *Nov. 4, 2014

(54) FRONT CONTACT SOLAR CELL WITH FORMED EMITTER

(75) Inventor: Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/495,577

(22) Filed: Jun. 13, 2012

(65) Prior Publication Data
US 2014/0038338 A1 Feb. 6, 2014

Related U.S. Application Data

(62) Division of application No. 12/070,742, filed on Feb. 20, 2008, now Pat. No. 8,222,516.

(51) Int. Cl.
*H01L 31/00* (2006.01)
*H01L 21/00* (2006.01)
*H01L 31/0232* (2014.01)
*H01L 31/18* (2006.01)
*H01L 31/0236* (2006.01)
*H01L 31/0745* (2012.01)

(52) U.S. Cl.
CPC ........ *H01L 31/1804* (2013.01); *H01L 31/0236* (2013.01); *Y02E 10/547* (2013.01); *Y02E 10/52* (2013.01); *H01L 31/0745* (2013.01)
USPC ............. 136/255; 136/256; 136/258; 438/57; 438/69; 438/72; 438/97; 438/98; 257/436; 257/461

(58) Field of Classification Search
CPC ............ H01L 31/0745; H01L 31/1804; H01L 31/0236; Y02E 10/547; Y02E 10/52
USPC ........ 136/261, 255, 256, 258; 438/57, 69, 72, 438/97, 98; 257/436, 461
See application file for complete search history.

(56) References Cited

U.S. PATENT DOCUMENTS 3,961,997 A 6/1976 Chu
4,427,839 A 1/1984 Hall
(Continued)

FOREIGN PATENT DOCUMENTS

WO    WO 2008/004791    1/2008

OTHER PUBLICATIONS

Lindholm, "Heavily doped Polysilicon-Contact Solar Cells", IEEE Electron Device Letters, vol. EDL-6, No. 7, pp. 363-365, Jul. 1985.*

(Continued)

*Primary Examiner* — Devina Pillay
(74) *Attorney, Agent, or Firm* — Okamoto & Benedicto LLP

(57) ABSTRACT

A bipolar solar cell includes a backside junction formed by an N-type silicon substrate and a P-type polysilicon emitter formed on the backside of the solar cell. An antireflection layer may be formed on a textured front surface of the silicon substrate. A negative polarity metal contact on the front side of the solar cell makes an electrical connection to the substrate, while a positive polarity metal contact on the backside of the solar cell makes an electrical connection to the polysilicon emitter. An external electrical circuit may be connected to the negative and positive metal contacts to be powered by the solar cell. The positive polarity metal contact may form an infrared reflecting layer with an underlying dielectric layer for increased solar radiation collection.

20 Claims, 7 Drawing Sheets

(56) References Cited

U.S. PATENT DOCUMENTS

| | | | | |
|---|---|---|---|---|
| 4,665,277 | A | 5/1987 | Sah et al. | |
| 4,927,770 | A | 5/1990 | Swanson | |
| 5,030,295 | A | 7/1991 | Swanson et al. | |
| 5,053,083 | A | 10/1991 | Sinton | |
| 5,057,439 | A * | 10/1991 | Swanson et al. | 438/98 |
| 5,164,019 | A | 11/1992 | Sinton | |
| 5,217,539 | A | 6/1993 | Fraas et al. | |
| 5,266,125 | A | 11/1993 | Rand et al. | |
| 5,360,990 | A | 11/1994 | Swanson | |
| 5,369,291 | A | 11/1994 | Swanson | |
| 5,449,626 | A | 9/1995 | Hezel | |
| 5,479,018 | A | 12/1995 | McKee et al. | |
| 5,620,904 | A | 4/1997 | Hanoka | |
| 5,641,362 | A | 6/1997 | Meier | |
| 5,693,578 | A | 12/1997 | Nakanishi et al. | |
| 6,262,359 | B1 * | 7/2001 | Meier et al. | 136/256 |
| 6,274,402 | B1 | 8/2001 | Verlinden et al. | |
| 6,313,395 | B1 | 11/2001 | Crane et al. | |
| 6,333,457 | B1 | 12/2001 | Mulligan et al. | |
| 6,337,283 | B1 | 1/2002 | Verlinden et al. | |
| 6,387,726 | B1 | 5/2002 | Verlinden et al. | |
| 6,423,568 | B1 | 7/2002 | Verlinden et al. | |
| 6,524,880 | B2 | 2/2003 | Moon et al. | |
| 6,638,788 | B2 | 10/2003 | Emoto et al. | |
| 6,998,288 | B1 * | 2/2006 | Smith et al. | 438/48 |
| 7,135,350 | B1 | 11/2006 | Smith et al. | |
| 7,468,485 | B1 * | 12/2008 | Swanson | 136/243 |
| 7,633,006 | B1 * | 12/2009 | Swanson | 136/258 |
| 8,207,444 | B2 * | 6/2012 | Cousins | 136/258 |
| 8,222,516 | B2 | 7/2012 | Cousins | |
| 2002/0153039 | A1 * | 10/2002 | Moon et al. | 136/256 |
| 2003/0134469 | A1 | 7/2003 | Horzel et al. | |
| 2004/0200520 | A1 | 10/2004 | Mulligan et al. | |
| 2005/0016585 | A1 | 1/2005 | Munzer | |
| 2005/0268963 | A1 * | 12/2005 | Jordan et al. | 136/256 |
| 2006/0096635 | A1 | 5/2006 | Tuttle | |
| 2006/0130891 | A1 | 6/2006 | Carlson et al. | |
| 2006/0157103 | A1 | 7/2006 | Sheats et al. | |
| 2006/0185716 | A1 | 8/2006 | Murozono et al. | |
| 2007/0023081 | A1 | 2/2007 | Johnson et al. | |
| 2007/0082206 | A1 | 4/2007 | Hartig | |
| 2008/0078444 | A1 | 4/2008 | Atanackovic | |
| 2008/0173347 | A1 | 7/2008 | Korevaar et al. | |
| 2009/0159111 | A1 | 6/2009 | Jawarani et al. | |
| 2011/0114171 | A1 | 5/2011 | Meier et al. | |

OTHER PUBLICATIONS

Silvestre, "Series Resistance in Double-Polysilicon Contacted Silicon Solar Cells", IEEE, 25$^{th}$ PVSC Washington DC, May 1996, pp. 497-500.*

* cited by examiner

101
FIG. 4A
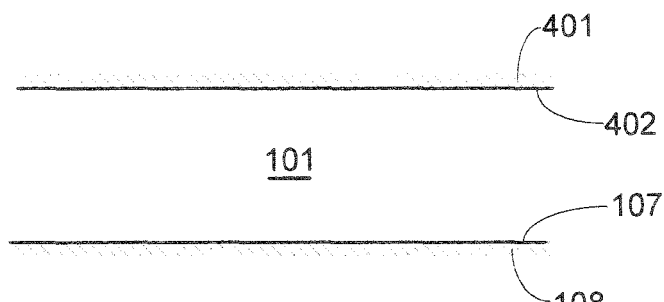
FIG. 4B
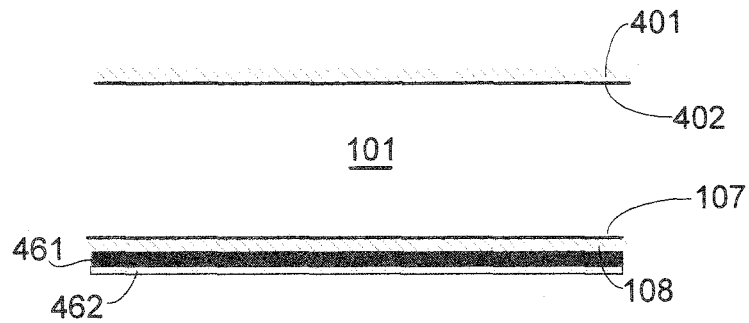
FIG. 4C
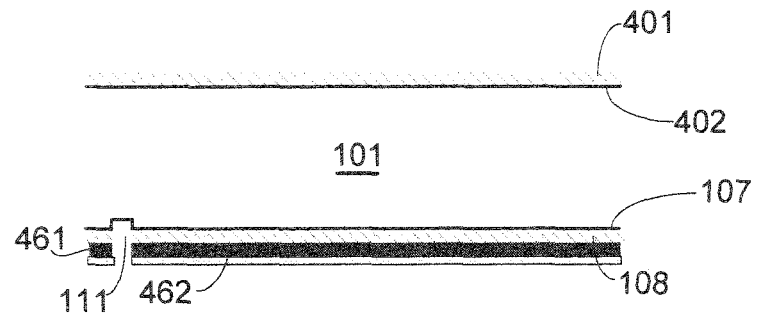
FIG. 4D

FRONT CONTACT SOLAR CELL WITH FORMED EMITTER

REFERENCE TO RELATED APPLICATION

This application is a divisional of U.S. application Ser. No. 12/070,742, filed on Feb. 20, 2008, which is incorporated herein by reference in its entirety.

STATEMENT REGARDING FEDERALLY SPONSORED RESEARCH OR DEVELOPMENT

The invention described herein was made with Governmental support under contract number DE-FC36-076017043 awarded by the United States Department of Energy. The Government may have certain rights in the invention.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. A solar cell includes P-type and N-type diffusion regions that form a junction. Solar radiation impinging on the solar cell creates electrons and holes that migrate to the diffusion regions, thereby creating voltage differentials between the diffusion regions. In a backside contact solar cell, both the diffusion regions and the metal contacts coupled to them are on the backside of the solar cell. The metal contacts allow an external electrical circuit to be coupled to and be powered by the solar cell.

In a front contact solar cell, at least one of the metal contacts making an electrical connection to a diffusion region is on the front side of the solar cell. The front side of the solar cell, which is opposite the backside, faces the sun during normal operation to collect solar radiation. While backside contact solar cells have an aesthetic advantage over front contact solar cells due to the absence of metal contacts on the front side, and are thus preferred for residential applications, aesthetics is not a major requirement for power plants and other applications where power generation is the main concern. Disclosed herein are structures for a relatively efficient and cost-effective front contact solar cell and processes for manufacturing same.

SUMMARY

A bipolar solar cell includes a backside junction formed by an N-type silicon substrate and a P-type polysilicon emitter formed on the backside of the solar cell. An antireflection layer may be formed on a textured front surface of the silicon substrate. A negative polarity metal contact on the front side of the solar cell makes an electrical connection to the substrate, while a positive polarity metal contact on the backside of the solar cell makes an electrical connection to the polysilicon emitter. An external electrical circuit may be connected to the negative and positive metal contacts to be powered by the solar cell. The positive polarity metal contact may form an infrared reflecting layer with an underlying dielectric layer for increased solar radiation collection.

These and other features of the present invention will be readily apparent to persons of ordinary skill in the art upon reading the entirety of this disclosure, which includes the accompanying drawings and claims.

The use of the same reference label in different figures indicates the same or like components. The figures are not drawn to scale.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
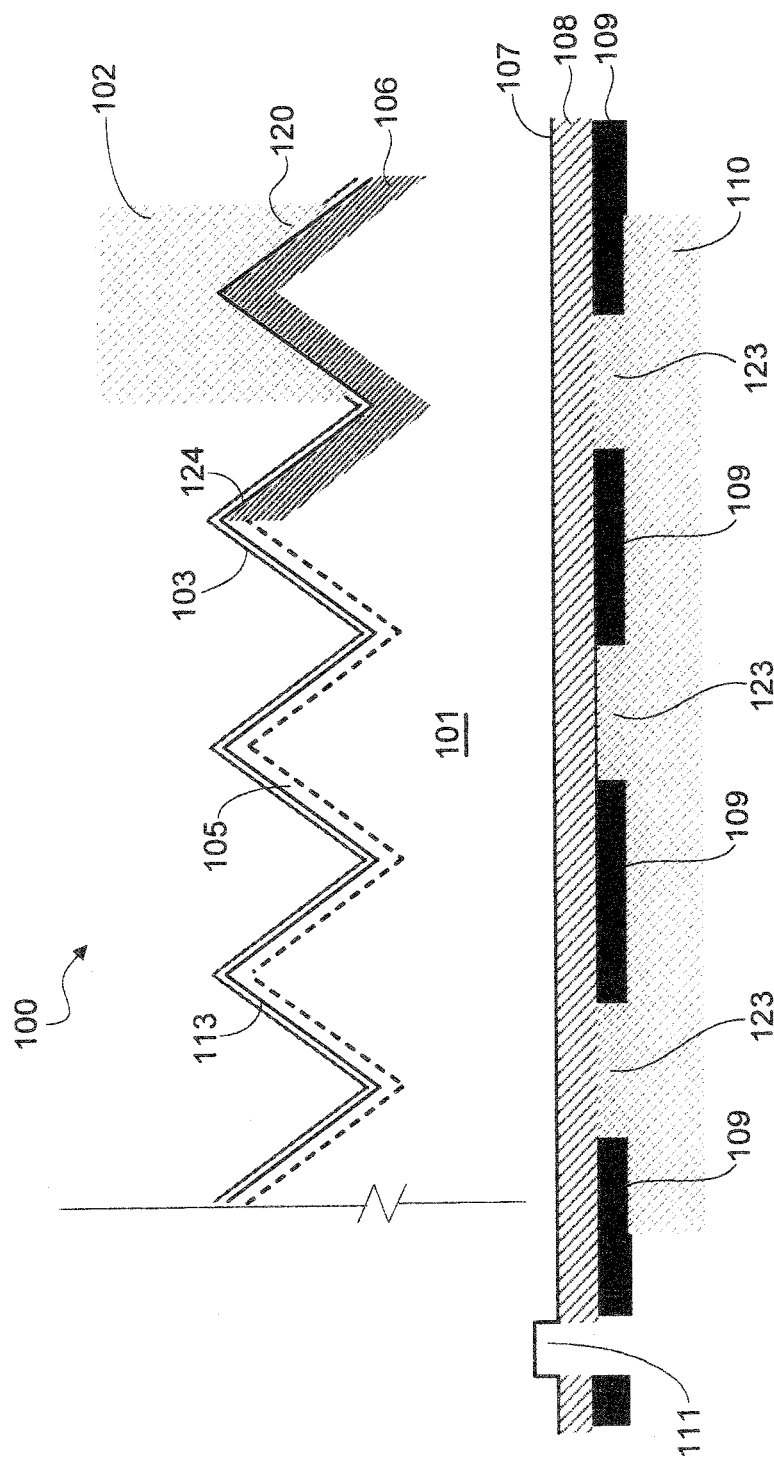
FIG. 1 schematically shows a cross-section of a solar cell in accordance with an embodiment of the present invention.

FIG. 1 schematically shows a cross-section of a solar cell 100 in accordance with an embodiment of the present invention. The solar cell 100 has a front side where a metal contact 102 is located and a backside on a same side as the metal contact 110. The front side faces the sun during normal operation to collect solar radiation.

In the example of FIG. 1, the solar cell 100 includes a backside junction formed by a P-type doped polysilicon emitter 108 serving as a P-type diffusion region and an N-type silicon substrate 101 serving as an N-type diffusion region. The N-type silicon substrate 101 may comprise a long lifetime (e.g., 2 to 5 ms) N-type silicon wafer and may have a thickness of about 100 to 250 μm as measured from the backside surface to a tip of the textured front side surface of the substrate. The front side surface of the substrate 101 is randomly textured (labeled as 113) and includes N-type doped regions 105 and 106 formed in the substrate. The N-type doped region 105 provides low front surface recombination and improves lateral conductivity whilst not compromising the blue response of the solar cell. The region 106, which may be a phosphorus diffusion, provides low contact resistance and minimizes contact recombination. The region 106 is also referred to as an "N-dot" because, in one embodiment, it forms a dot-shape to minimize the area of heavily diffused regions on the front surface. The N-type doped region 105 may have a sheet resistance of 100 to 500 Ω/sq, whilst the n-type doped region 106 may have a sheet resistance of 10 to 50 Ω/sq.

An antireflective coating (ARC) of silicon nitride layer 103 is formed on the textured front side surface of the substrate 101. The texture front side surface and the silicon nitride layer 103 help improve solar radiation collection efficiency. A passivating oxide 124 may comprise silicon dioxide thermally grown to a thickness of about 10 to 250 Angstroms on the front side surface of the substrate 101.

In one embodiment, the polysilicon emitter 108 is formed on a tunnel oxide layer 107. The polysilicon emitter 108 may be formed by forming a layer of polysilicon using Chemical Vapor Deposition (CVD), such as Low Pressure CVD (LPCVD) or Plasma Enhanced CVD (PECVD), and thermal anneal. The polysilicon emitter 108 may have a sheet resistance of 100 Ω/sq, and a thickness of 1000 to 2000 Angstroms. The tunnel oxide layer 107 may comprise silicon dioxide thermally grown to a thickness of about 10 to 50 Angstroms on the backside surface of the substrate 101. A metal contact 110 electrically connects to the polysilicon emitter 108 through contact holes 123 formed through a dielectric comprising a silicon dioxide layer 109. The metal contact 110 provides a positive polarity terminal to allow an external electrical circuit to be coupled to and be powered by the solar cell 100. The silicon dioxide layer 109 provides electrical isolation and allows the metal contact 110 to serve as an infrared reflecting layer for increased solar radiation collection. In one embodiment, the metal contact 110 comprises silver having a conductance of about 5-25 mΩ·cm and a thickness of about 15-35 μm.

On the front side of the solar cell 100, the metal contact 102 electrically connects to the region 106 through a contact hole 120 formed through the silicon nitride layer 103. The metal contact 102 provides a negative polarity terminal to allow an external electrical circuit to be coupled to and be powered by the solar cell 100. In one embodiment, the metal contact 102 comprises silver having a sheet resistance of about 5 mΩ·cm and a thickness of about 15 μm. The pitch between adjacent metal contacts 102 may be about 1 to 4 mm. In one embodiment, the metal contacts 102 are spaced at 400 to 1000 μm along each metal contact 102 (see FIG. 2).

In the example of FIG. 1, the edge isolation trench 111 is formed through the silicon dioxide layer 109, the polysilicon emitter 108, and a portion of the substrate 101 to provide edge electrical isolation.

Figure 2:
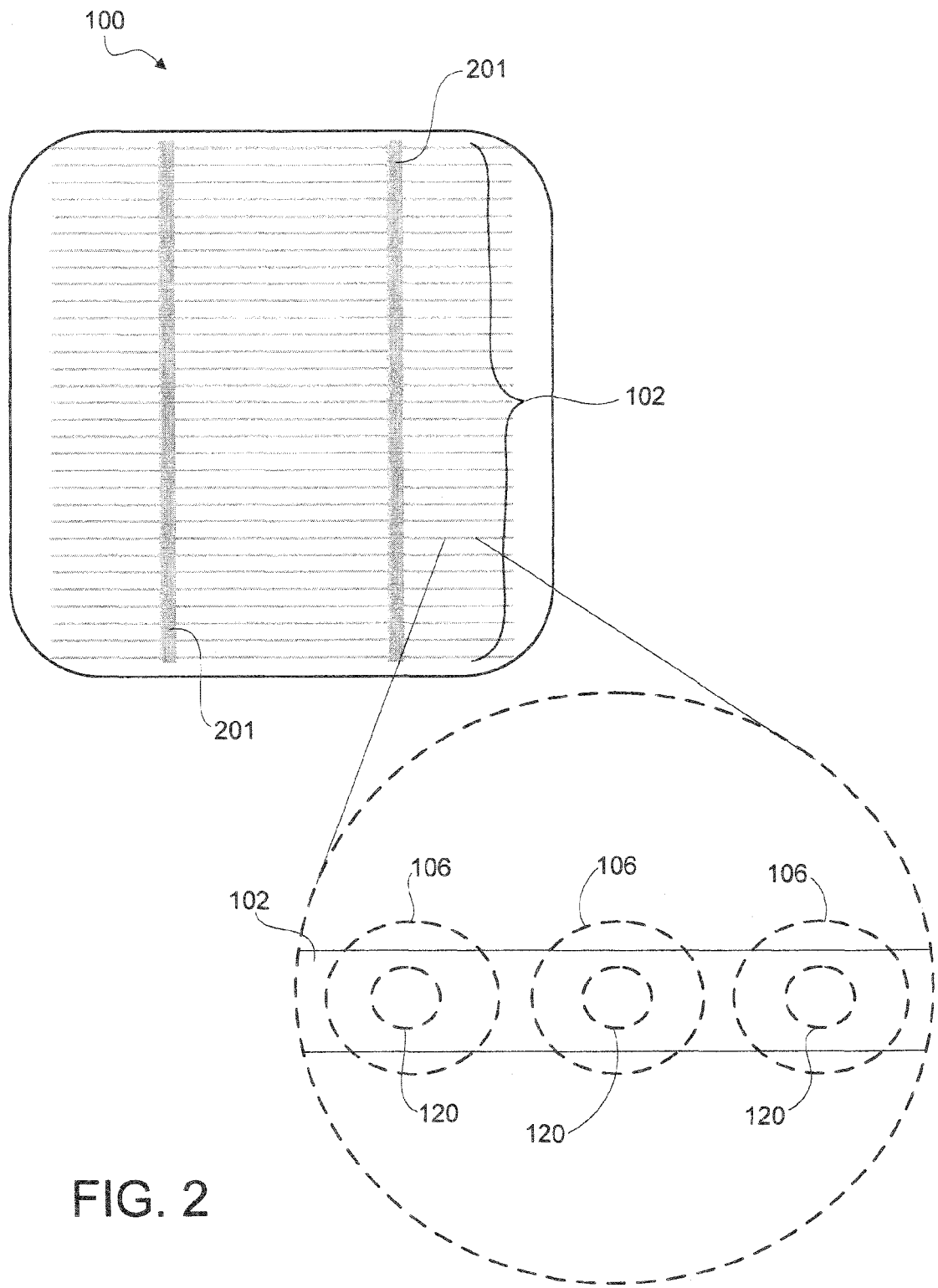
FIG. 2 is a plan view schematically showing the front side of the solar cell of FIG. 1.

FIG. 2 is a plan view schematically showing the front side of the solar cell 100. In the example of FIG. 2, two bus bars 201 run parallel on the front side of the substrate 101. The contact holes 120, in which the metal contacts 102 are formed, may each have a diameter of about 50 to 200 μm. A plurality of metal contacts 102 is formed perpendicular to the bus bars 201. Each metal contact 102 may have a width of about 60-120 μm.

Figure 3:
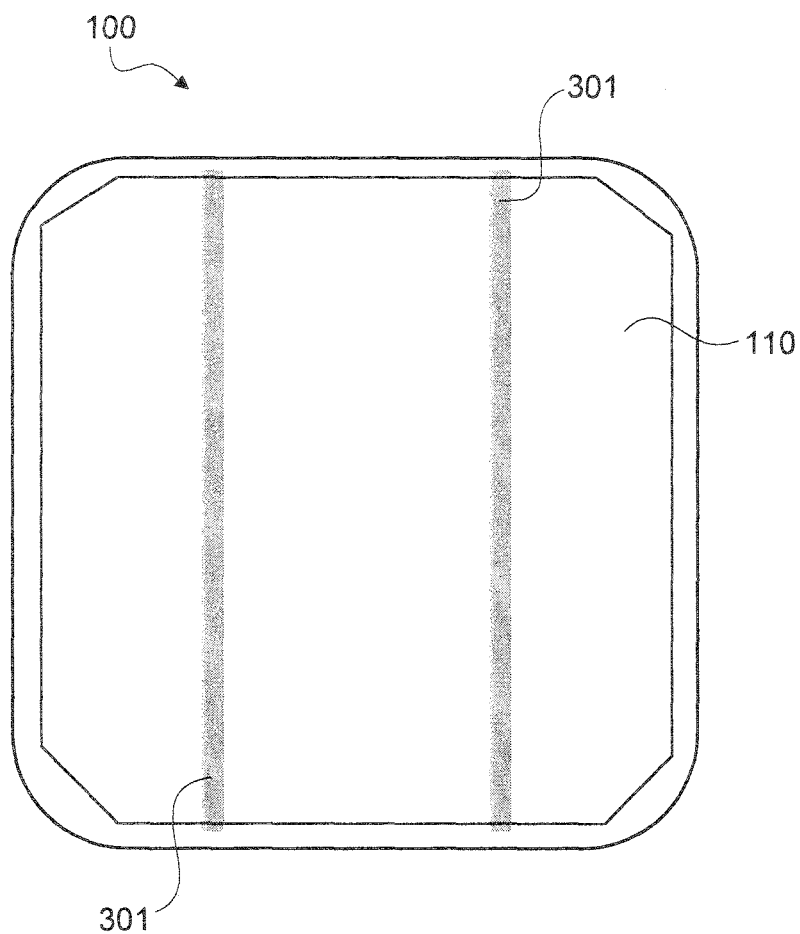
FIG. 3 is a plan view schematically showing the backside of the solar cell of FIG. 1.

FIG. 3 is a plan view schematically showing the backside of the solar cell 100. In the example of FIG. 3, two bus bars 301, which are electrically coupled to metal contacts 110, run parallel on the backside. In practice, the bus bars 201 and 301 will be electrically connected to corresponding bus bars of adjacent solar cells to form an array of solar cells.

Solar cells have gained wide acceptance among energy consumers as a viable renewable energy source. Still, to be competitive with other energy sources, a solar cell manufacturer must be able to fabricate an efficient solar cell at relatively low cost. With this goal in mind, a process for manufacturing the solar cell 100 is now discussed with reference to FIGS. 4A-4M.

FIG. 4, which comprises FIGS. 4A-4M, schematically illustrates the fabrication of the solar cell 100 in accordance with an embodiment of the present invention.

In FIG. 4A, an N-type silicon substrate 101 is prepared for processing into a solar cell by undergoing a damage etch step. The substrate 101 is in wafer form in this example, and is thus typically received with damaged surfaces due to the sawing process used by the wafer vendor to slice the substrate 101 from its ingot. The substrate 101 may be about 100 to 200 microns thick as received from the wafer vendor. In one embodiment, the damage etch step involves removal of about 10 to 20 μm from each side of the substrate 101 using a wet etch process comprising potassium hydroxide. The damage etch step may also include cleaning of the substrate 101 to remove metal contamination.

In FIG. 4B, tunnel oxides 402 and 107 are formed on the front and back surfaces, respectively, of the substrate 101. The tunnel oxides 402 and 107 may comprise silicon dioxide thermally grown to a thickness of about 10 to 50 Angstroms on the surfaces of the N-type silicon substrate 101. A layer of polysilicon is then formed on the tunnel oxides 402 and 107 to form the polysilicon layer 401 and the polysilicon emitter 108, respectively. Each of the polysilicon layer 401 and the polysilicon emitter 108 may be formed to a thickness of about 1000 to 2000 Angstroms by CVD.

In FIG. 4C, a P-type dopant source 461 is formed on the polysilicon emitter 108. As its name implies, the P-type dopant source 461 provides a source of P-type dopants for diffusion into the polysilicon emitter 108 in a subsequent dopant drive-in step. A dielectric capping layer 462 is formed on the P-type dopant source 461 to prevent dopants from escaping from the backside of the solar cell during the drive-in step. In one embodiment, the P-type dopant source comprises BSG (borosilicate glass) deposited to a thickness of about 500 to 1000 Angstroms by atmospheric pressure CVD (APCVD) and has a dopant concentration of 5 to 10% by weight, while the capping layer 462 comprises undoped silicon dioxide formed to a thickness of about 2000 to 3000 Angstroms also by APCVD.

In FIG. 4D, the edge isolation trench 111 is formed near the edge of the substrate 101 on the backside. The trench 111 is relatively shallow (e.g., 10 μm deep into the substrate 101) and provides edge electrical isolation. In one embodiment, the trench 111 is formed by cutting through the capping layer 462, the P-type dopant source 461, the polysilicon emitter 108, the tunnel oxide 107, and into a shallow portion of the substrate 101 using a laser.

Figure 4E:
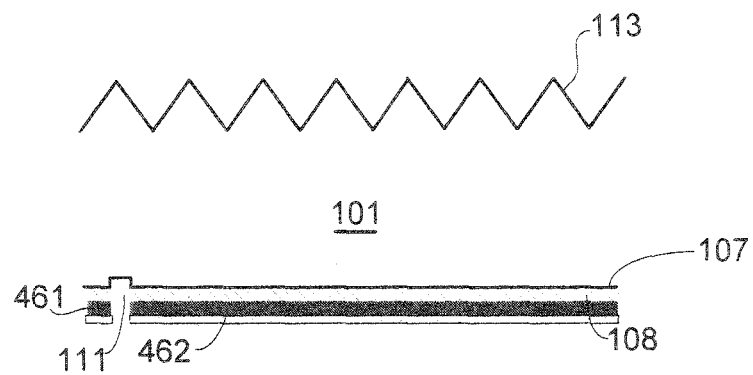
FIG. 4, which comprises FIGS. 4A-4M, schematically illustrates the fabrication of the solar cell of FIG. 1 in accordance with an embodiment of the present invention.

In FIG. 4E, exposed regions on the front surface of the substrate 101 are randomly textured to form the textured surface 113. In one embodiment, the front surface of the substrate 101 is textured with random pyramids using a wet etch process comprising potassium hydroxide and isopropyl alcohol.

Figure 4F:
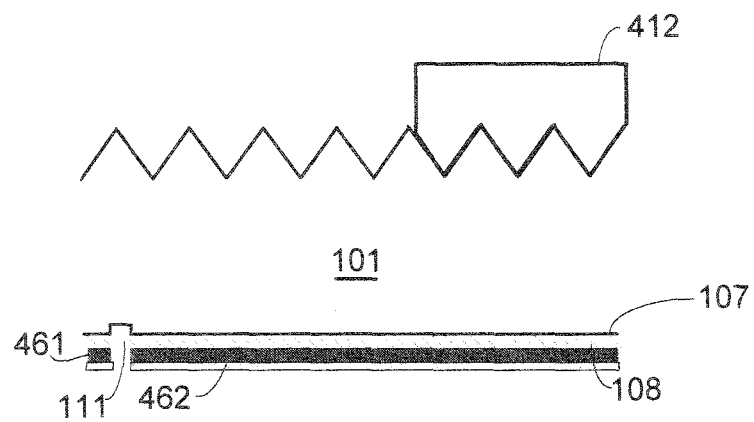

In FIG. 4F, an N-type dopant source 412 is formed on regions of the textured surface 113 where contact holes 120 (see FIG. 1) will be subsequently formed to allow subsequently formed metal contacts 102 to electrically connect to the substrate 101. As its name implies, the N-type dopant source 412 provides a source of N-type dopants for diffusion into the front side of the substrate 101. In one embodiment, the N-type dopant source 412 is formed by inkjet printing the dopant material directly onto the substrate 101.

In one embodiment, the N-type dopant source 412 comprises silicon dioxide doped with phosphorus. Only one N-type dopant source 412 is shown in FIG. 4F for clarity of illustration. In practice, there are several dot-shaped N-type dopant sources 412, one for each region where a contact hole 120 is to be formed (see FIG. 2). This allows formation of several dot shaped N-type doped regions 106 (see FIG. 1) after a subsequently performed drive-in step now discussed with reference to FIG. 4G.

Figure 4G:
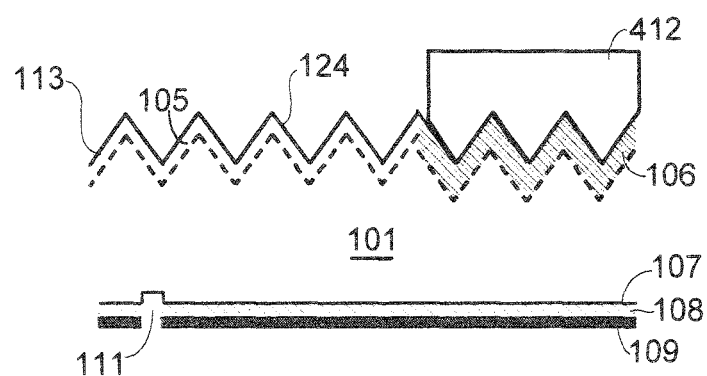

In FIG. 4G, a dopant drive-in step is performed to diffuse N-type dopants from the N-type dopant source 412 into the substrate 101 to form the N-type dope region 106, to diffuse P-type dopants from the P-type dopant source 461 to the polysilicon emitter 108, and to diffuse N-type dopants into the front side of the substrate 101 to form the N-type doped region 105. Silicon dioxide layer 109 represents layers 461 and 462 after the drive-in step. The polysilicon emitter 108 also becomes a P-type doped layer after the drive-in step. The N-type doped region 105 may be formed by exposing the sample of FIG. 4G to phosphorus in a diffusion furnace, for example. The use of the N-type dopant source 412 allows for a more controlled and concentrated N-type diffusion to the N-type doped region 106. The thin thermal silicon dioxide layer 124 may be grown on the textured surface 113 during the drive-in process.

The drive-in step to dope the polysilicon emitter 108 on the backside and to form the N-type doped regions 105 and 106 on the front side may be formed in-situ, which in the context of the present disclosure means a single manual (i.e., by fabrication personnel) loading of the substrate 101 in a furnace or other single chamber or multi-chamber processing tool. In one embodiment, the drive-in step is performed in a diffusion furnace. The preceding sequence of steps leading to the drive-in step allows for in-situ diffusion, which advantageously helps in lowering fabrication cost.

It is to be noted that the step of using an N-type dopant source 412 to diffuse dopants into the N-type doped region 106 may be omitted in some applications. That is, in an alternative process, the formation of the N-type dopant source 412 in FIG. 4F may be omitted. In that case, the N-type doped regions 105 and 106 will be both doped by introduction of an N-type dopant in the diffusion furnace during the drive-in step. All other process steps disclosed herein remain essentially the same.

Figure 4H:
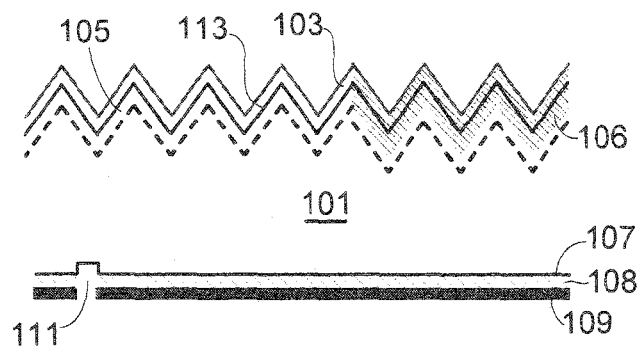

In FIG. 4H, the antireflective coating of silicon nitride layer 103 is formed over the textured surface 113 after removal of the N-type dopant source 412. Besides being an antireflective coating, the silicon nitride layer 103 also advantageously serves as a dielectric, enabling the selective contacts to be formed on the front surface to reduce front surface recombination. The silicon nitride layer 103 may be formed to a thickness of about 450 Angstroms by PECVD, for example.

Figure 4I:
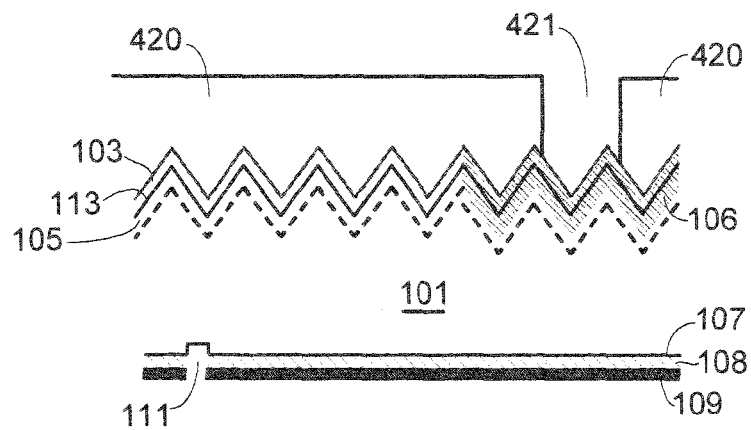

In FIG. 4I, a front contact mask 420 is formed on the silicon nitride layer 103 to create a pattern 421 defining the contact holes 120 (see FIG. 1). The mask 420 may comprise an acid resistance organic material, such as a resist, and formed using a printing process, such as screen printing or inkjet printing.

Figure 4J:
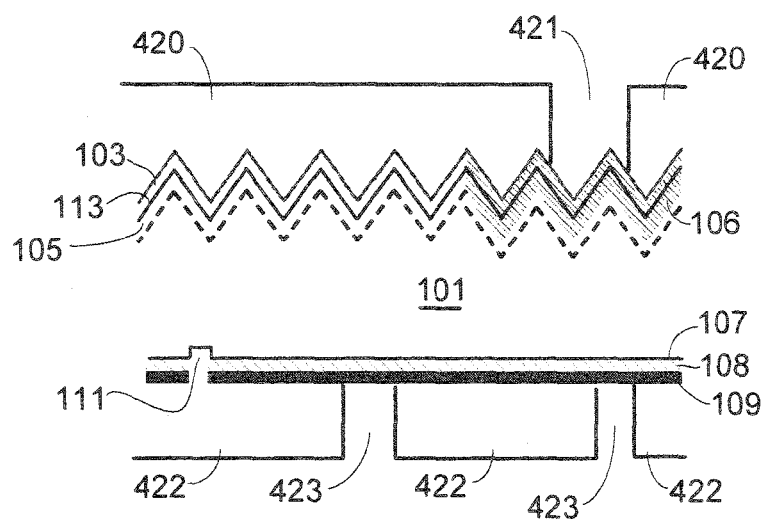

In FIG. 4J, a back contact mask 422 is formed on the silicon dioxide layer 109 to create patterns 423 defining the contact holes 123 (see FIG. 1). Similar to the mask 420, the mask 422 may comprise an organic material formed using a printing process.

Figure 4K:
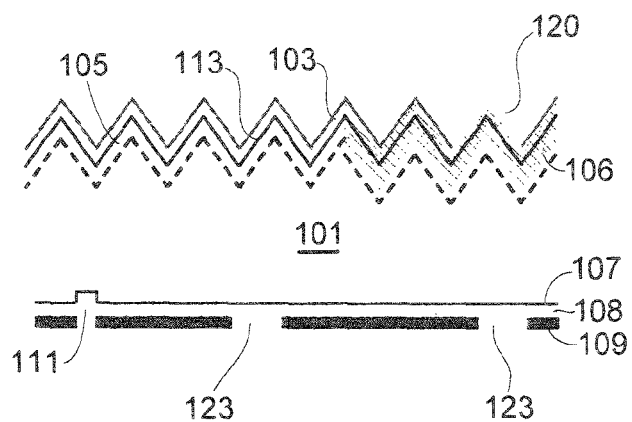

In FIG. 4K, contact holes 120 and 123 are formed by removing exposed portions of the silicon nitride layer 103 and the silicon dioxide 109 in a contact etch step. In one embodiment, the contact holes 120 are formed by using a selective etch process that removes exposed portions of the silicon nitride layer 103 and stops on the substrate 101. The same etch process removes exposed portions of the silicon dioxide 109 and stops on the polysilicon emitter 108. In one embodiment, the etch process comprises a BOE (buffered oxide etch).

Figure 4L:
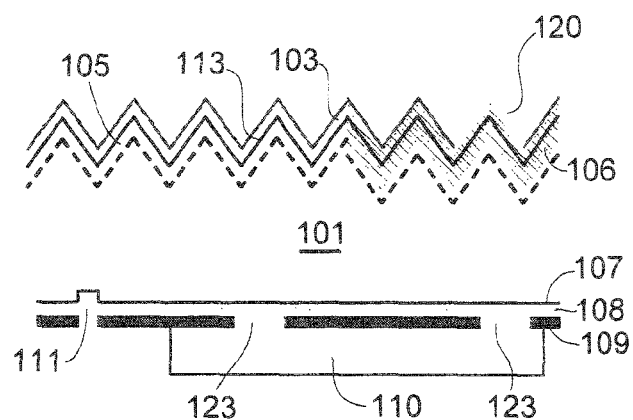

In FIG. 4L, the metal contact 110 is formed on the silicon dioxide layer 109 to fill the contact holes 123 and make electrical connection to the polysilicon emitter 108. The metal contact 110 may be formed using a printing process. The metal contact 110 may comprise silver, which, together with the silicon dioxide layer 109, makes an excellent backside infrared reflector. Other metals may also be used as a metal contact 110, such as aluminum, for example.

Figure 4M:
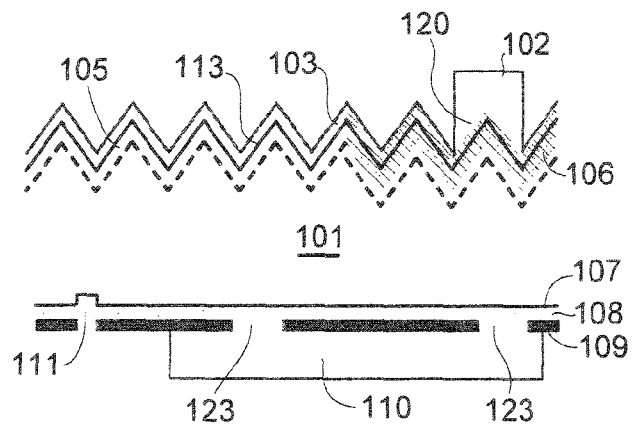

In FIG. 4M, the metal contact 120 is formed on the silicon nitride layer 103 to fill the contact holes 120 and make electrical connection to the substrate 101. The metal contact 120 may comprise silver and formed using a printing process.

Formation of the metal contacts 110 and 102 may be followed by a firing step. The firing step is applicable when using screen printed silver paste as metal contacts, but not when using other processes or metals. The solar cell 100 may then be visually inspected and tested.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a solar cell having a front side facing the sun to collect solar radiation during normal operation and a backside opposite the front side, the method comprising:
    forming a layer of polysilicon over a back surface of an N-type silicon substrate on the backside of the solar cell;
    forming a P-type dopant source over the layer of polysilicon;
    forming a capping layer over the P-type dopant source;
    diffusing P-type dopants from the P-type dopant source to the layer of polysilicon to form a backside junction with the N-type silicon substrate;
    diffusing N-type dopants into a front surface of the N-type silicon substrate; and
    forming a metal contact on the front side of the solar cell, wherein the metal contact is electrically coupled to the N-type silicon substrate.

2. The method of claim 1 wherein the P-type dopant source comprises borosilicate glass.

3. The method of claim 1 wherein diffusing N-type dopants into the front surface of the N-type silicon substrate includes forming an N-type dopant source over the N-type silicon substrate and diffusing N-type dopants from the N-type dopants source into the N-type silicon substrate.

4. The method of claim 3 wherein the N-type dopant source comprises phosphorus doped silicon dioxide.

5. The method of claim 1 further comprising:
    texturing the front surface of the N-type silicon substrate; and
    forming an antireflective layer over the textured front surface of the N-type silicon substrate.

6. The method of claim 5 wherein the antireflective layer comprises silicon nitride.

7. The method of claim 1 wherein the diffusion of P-type dopants from the P-type dopant source to the layer of polysilicon and the diffusion of N-type dopants into the front surface of the N-type silicon substrate are performed in situ.

8. The method of claim 1 wherein the capping layer comprises undoped silicon dioxide.

9. A method of fabricating a solar cell comprising:
    forming a layer of polysilicon over a back surface of a silicon substrate;
    forming a first dopant source layer over the layer of polysilicon;
    diffusing dopants from the first dopant source layer to the layer of polysilicon to form a backside junction with the silicon substrate;
    diffusing dopants into a front surface of the silicon substrate, the front surface of the silicon substrate facing the sun during normal operation; and
    forming a metal contact on the front surface of the silicon substrate, wherein the metal contact is electrically coupled to the silicon substrate.

10. The method of claim 9 wherein the first dopant source layer comprises P-type dopants.

11. The method of claim 9 wherein the first dopant source layer comprises borosilicate glass.

12. The method of claim 9 wherein diffusing dopants into the front surface of the silicon substrate comprises forming a second dopant source layer over the silicon substrate and diffusing dopants from the second dopant source layer into the silicon substrate.

13. The method of claim 12 wherein the second dopant source layer comprises phosphorus doped silicon dioxide.

14. The method of claim 9 further comprising:
   texturing the front surface of the silicon substrate; and
   forming an antireflective layer over the textured front surface of the silicon substrate.

15. The method of claim 9 wherein the diffusion of dopants from the first dopant source layer to the layer of polysilicon and the diffusion of dopants into the front surface of the silicon substrate are performed in situ.

16. A method of fabricating a solar cell comprising:
   forming an oxide layer over a back surface of a silicon substrate;
   forming a layer of polysilicon over the oxide layer;
   diffusing dopants into the layer of polysilicon to form a backside junction with the silicon substrate;
   diffusing dopants into a front surface of the silicon substrate, the front surface of the silicon substrate facing the sun during normal operation; and
   forming a metal contact on the front surface of the silicon substrate, wherein the metal contact is electrically coupled to the silicon substrate.

17. The method of claim 16 wherein diffusing dopants into the layer of polysilicon to form the backside junction with the silicon substrate comprises:
   forming a first dopant source layer over the layer of polysilicon; and
   diffusing dopants from the first dopant source layer into the layer of polysilicon.

18. The method of claim 16 wherein diffusing dopants into the front surface of the silicon substrate comprises forming a second dopant source layer over the silicon substrate and diffusing dopants from the second dopant source layer into the silicon substrate.

19. The method of claim 16 further comprising:
   texturing the front surface of the silicon substrate.

20. The method of claim 19 further comprising:
   forming an antireflective layer over the textured front surface of the silicon substrate.

* * * * *